United States Patent
Cousins

(10) Patent No.: US 9,548,409 B2
(45) Date of Patent: Jan. 17, 2017

(54) SOLAR CELL HAVING DOPED SEMICONDUCTOR HETEROJUNCTION CONTACTS

(71) Applicant: SunPower Corporation, San Jose, CA (US)

(72) Inventor: Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 275 days.

(21) Appl. No.: 14/459,062

(22) Filed: Aug. 13, 2014

(65) Prior Publication Data
US 2014/0345688 A1    Nov. 27, 2014

Related U.S. Application Data

(63) Continuation of application No. 12/787,319, filed on May 25, 2010, now Pat. No. 8,815,631, which is a (Continued)

(51) Int. Cl.
| | |
|---|---|
| H01L 31/028 | (2006.01) |
| H01L 31/0392 | (2006.01) |
| H01L 31/0745 | (2012.01) |
| H01L 31/0747 | (2012.01) |
| H01L 31/0224 | (2006.01) |
| H01L 31/0376 | (2006.01) |
| H01L 31/068 | (2012.01) |
| H01L 31/18 | (2006.01) |
| H01L 31/0216 | (2014.01) |
| H01L 31/074 | (2012.01) |

(52) U.S. Cl.
CPC ... *H01L 31/03921* (2013.01); *H01L 31/02167* (2013.01); *H01L 31/022425* (2013.01); *H01L 31/022441* (2013.01); *H01L 31/03762* (2013.01); *H01L 31/068* (2013.01); *H01L 31/074* (2013.01); *H01L 31/0745* (2013.01); *H01L 31/0747* (2013.01); *H01L 31/1804* (2013.01); *Y02E 10/548* (2013.01); *Y02P 70/521* (2015.11)

(58) Field of Classification Search
CPC .......... H01L 31/03921; H01L 31/0745; H01L 31/0747; H01L 31/022425; H01L 31/03762; H01L 31/068; H01L 31/1804; H01L 31/02167; H01L 31/074
USPC .......................................................... 136/261
See application file for complete search history.

(56) References Cited

U.S. PATENT DOCUMENTS

| | | | |
|---|---|---|---|
| 4,272,641 A * | 6/1981 | Hanak | H01L 31/03762 136/249 |
| 5,057,439 A | 10/1991 | Swanson et al. | |

(Continued)

OTHER PUBLICATIONS

A.S. Gudovskikh, et al "Investigation of a-Si:H/c-SI heterojunction solar cells interface properties", Thin Solid Films, vol. 451-452, Mar. 22, 2004, pp. 345-349, XP004495124.

(Continued)

*Primary Examiner* — Jayne Mershon
(74) *Attorney, Agent, or Firm* — Okamoto & Benedicto LLP

(57) ABSTRACT

A silicon solar cell has doped amorphous silicon contacts formed on a tunnel silicon oxide layer on a surface of a silicon substrate. High temperature processing is unnecessary in fabricating the solar cell.

3 Claims, 5 Drawing Sheets

Related U.S. Application Data continuation of application No. 11/381,681, filed on May 4, 2006, now Pat. No. 7,737,357.

(56) References Cited

U.S. PATENT DOCUMENTS

| | | |
|---|---|---|
| 2002/0069911 A1 | 6/2002 | Nakamura et al. |
| 2005/0062041 A1 | 3/2005 | Terakawa et al. |
| 2009/0121273 A1* | 5/2009 | King ................. H01L 21/28194 |
| | | 257/316 |

OTHER PUBLICATIONS

First Examination Report for IN Patent Application No. 5636/CHENP/2008 dated, [Feb. 26, 2016], 2 sheets.

* cited by examiner

SOLAR CELL HAVING DOPED SEMICONDUCTOR HETEROJUNCTION CONTACTS

REFERENCE TO RELATED APPLICATION

This application is a continuation of U.S. application Ser. No. 12/787,319 filed on May 25, 2010, which is hereby incorporated by reference in its entirety. U.S. application Ser. No. 12/787,319 is a continuation of U.S. application Ser. No. 11/381,681, filed on May 4, 2006, which is incorporated herein by reference in its entirety.

BACKGROUND OF THE INVENTION

This invention relates generally to photovoltaic solar cells, and more particularly the invention relates to a solar cell structure which is efficient in operation and economical to manufacture.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the planar silicon cell the p-n junction is formed near a surface of the substrate which receives impinging radiation. Radiated photons create mobile carriers (holes and electrons) and the substrate which can be directed to an electrical circuit outside of the cell. Only photons having at least a minimum energy level (e.g., 1.1 electron volt for silicon) can generate an electron-hole pair in the semiconductor pair. Photons having less energy are either not absorbed or are absorbed as heat, and the excess energy of photons having more than 1.1 electron volt energy (e.g. photons have a wavelength of 1.1 μm and less) create heat. These and other losses limit the efficiency of silicon photovoltaic cells in directly converting solar energy to electricity to less than 30%.

Solar cells with interdigitated contacts of opposite polarity on the back surface of the cell are known and have numerous advantages over conventional solar cells with front side metal grids and blanket or grid metallized backside contacts, including improved photo-generation due to elimination of front grid shading, much reduced grid series resistance, and improved "blue" photo-response since heavy front surface doping is not required to minimize front contact resistance because there are no front contacts. In addition to the performance advantages, the back-contact cell structure allows simplified module assembly due to coplanar contacts. See Swanson U.S. Pat. No. 4,927,770 for example.

While interdigitated back-contact (IBC) solar cells have been fabricated, cost considerations have limited commercialization of the IBC solar cell. Heretofore, conventional microelectronics (integrated circuit) processing has been employed in fabricating IBC solar cells, including the use of backside diffusions, contacts, and metal lines fabricated by conventional microelectronics photolithography, thin film metallization, and etching processes. This fabrication process is capable of producing high efficiency solar cells, but the process is not cost effective for application in conventional low-cost, flat-plate solar panels. The key problem with practical realization of an IBC solar cell by this process is the high cost of fabrication, including etching, doping and mask alignment, and the use of thick metal conductor deposition by vacuum evaporation or sputtering. Further, the processing must be carried out in a clean room environment. Thus IBC solar cells fabricated using these methods have been restricted to application in high concentration solar cells or in very high value one-sun applications.

Copending application Ser. No. 11/306,510 combines a semiconductor substrate with acceptor and donor polymer contacts to provide a solar cell which is economically fabricated. Importantly, fabrication of the solar cell, is improved in cost and in reduced temperature cycling through use of inkjet application of the polymer contacts without the need for photoresist masking, etching, and dopant diffusion and annealing as is required in prior art solar cells.

The present invention utilizes a semiconductor such as amorphous silicon as donor and acceptor contact in a silicon solar sell which can be readily and cost effectively fabricated.

SUMMARY OF THE INVENTION

The invention utilizes doped amorphous silicon, Si-Ge, or III-V compounds as a donor or an acceptor contact in silicon solar cell. The contact material can be vapor deposited along with the dopant as necessary for donor or acceptor application. As used herein, "amorphous" silicon includes "poly crystalline" silicon.

When deposited on a single crystal silicon substrate, a tunnel oxide is first grown and separates a deposited amorphous silicon from the substrate to prevent re-crystallization of the amorphous silicon.

In an interdigitated back contact (IBC) cell, the front surface can be textured by chemical or physical abrasion to provide a radiation capturing surface with an anti-reflective and passivating coating such as silicon nitride, doped silicon carbide, or a thin coating of amorphous silicon over the textured surface.

The invention and object and features thereof will be more readily apparent from the following detailed description and appended claims when taken with the drawings.

DETAILED DESCRIPTION OF THE PREFERRED EMBODIMENTS

In accordance with one embodiment of the invention, an interdigitated back contact (IBC) solar cell comprising a silicon semiconductor body having first and second opposing major surfaces receives radiation through the first surface and has first and second patterns of acceptor doped amorphous silicon and donor doped amorphous silicon, respectively, on the second or back surface for receiving electron and hole carriers created in the silicon substrate by radiated photons. The structure is similar to prior art back contact solar cells which utilize doped P and N conductivity contacts formed in the substrates for receiving the holes and electrons created by radiation. However, the use doped P and N contacts in the substrate requires photoresist masking, etching, dopant diffusion, and high temperature processing in the fabrication of the solar cell. The use of acceptor and donor amorphous silicon contacts on the structure, in accordance with an embodiment of the invention, obviates the need for photoresist masking and dopant diffusion and the high temperature processing required in annealing the diffused dopants. A tunnel silicon oxide can be placed between the contacts and the substrate to prevent epitaxial growth of the amorphous silicon on the substrate.

Figure 1:
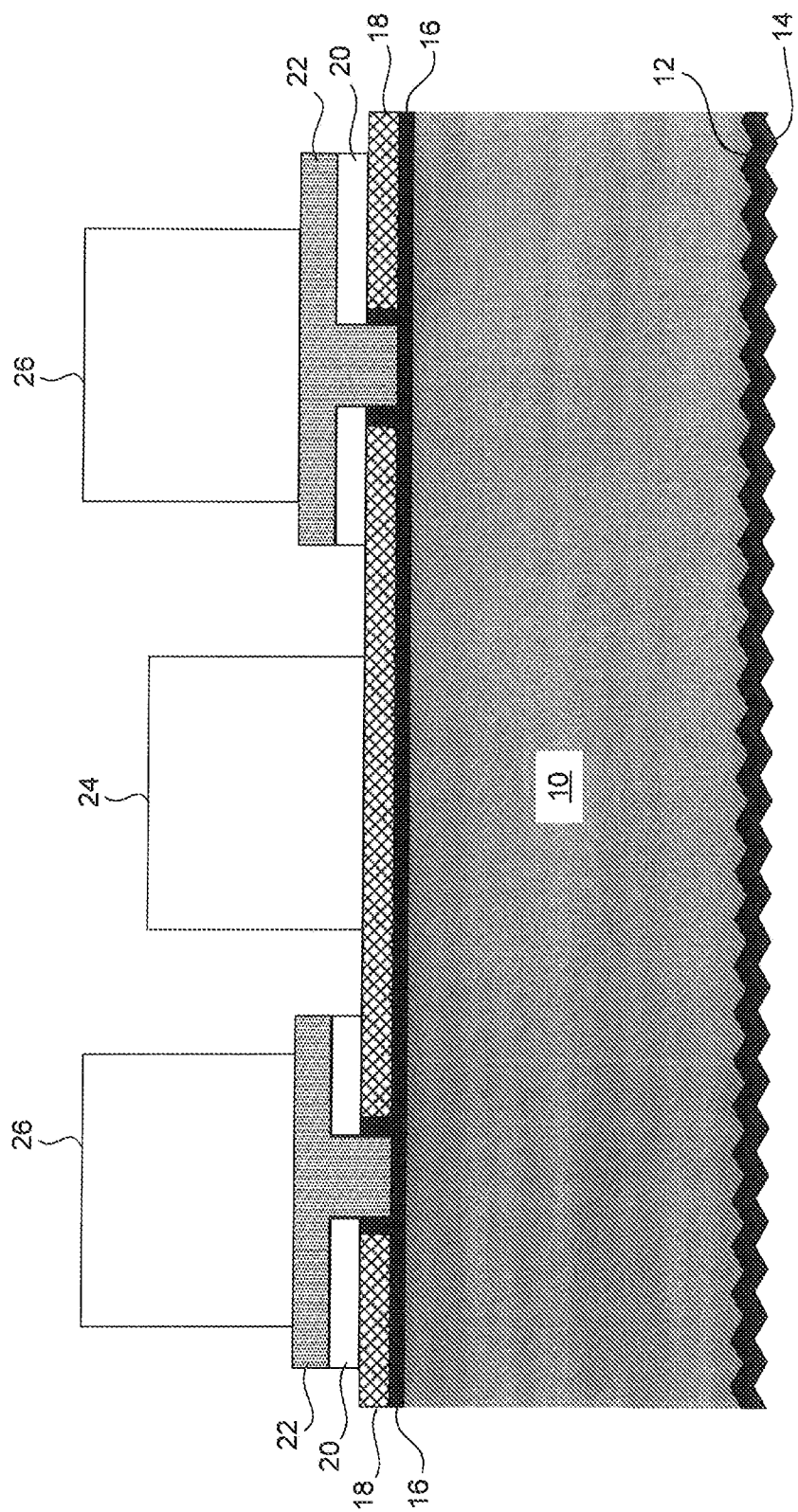
FIG. 1 is a side view in section of an interdigitated back contact solar cell including doped amorphous contact in accordance with one embodiment of the invention.

Consider now FIG. 1 which is a side view in section of an interdigitated back contact (IBC) solar cell in accordance with one embodiment of the invention. The cell includes a light n-type monocrystalline or polycrystalline substrate 10 having a front surface which receives radiation and a textured surface on which is formed a thin (e.g. 10-150 angstrom) tunnel silicon oxide layer 12 with a passivation coating 14 over tunnel oxide 12 which can comprise silicon nitride, doped silicon carbide, or a doped amorphous silicon layer.

On the back surface of substrate 10 is a second tunnel oxide layer 16 over which is formed P+ amorphous silicon contacts 18. A dielectric such as silicon oxide 20 separates P+ amorphous silicon 18 from N+ amorphous silicon 22 which is formed in openings through P+ amorphous silicon layer 18 and in contact with tunnel oxide 16. While the amorphous silicon layers 18, 22 are formed by low temperature vapor deposition, tunnel oxide 16 prevents any re-crystallization of the amorphous silicon by epitaxial growth from silicon substrate 10. Metal contact 24 engages P+ amorphous silicon layer 18, and metal contacts 26 engage N+ amorphous silicon layers 22.

The back contact heterojunction enhances the rear passivation of the solar cell by the inclusion of tunnel oxide 16, heterojunction field provided by the amorphous silicon contacts, and contact passivation. As will be described further herein below, a process benefit in making the device is that high temperature dopant drive is not required.

Figure 2A:
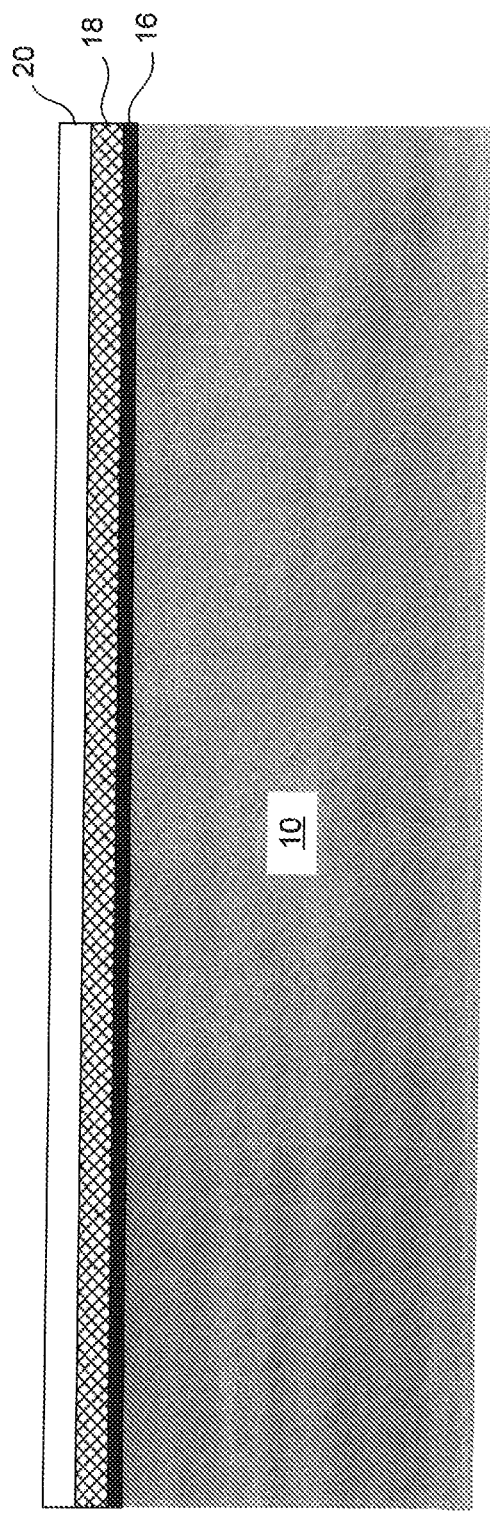
FIGS. 2A-2D are side views in section illustrating the solar cell of FIG. 1 during fabrication.
Figure 2B:
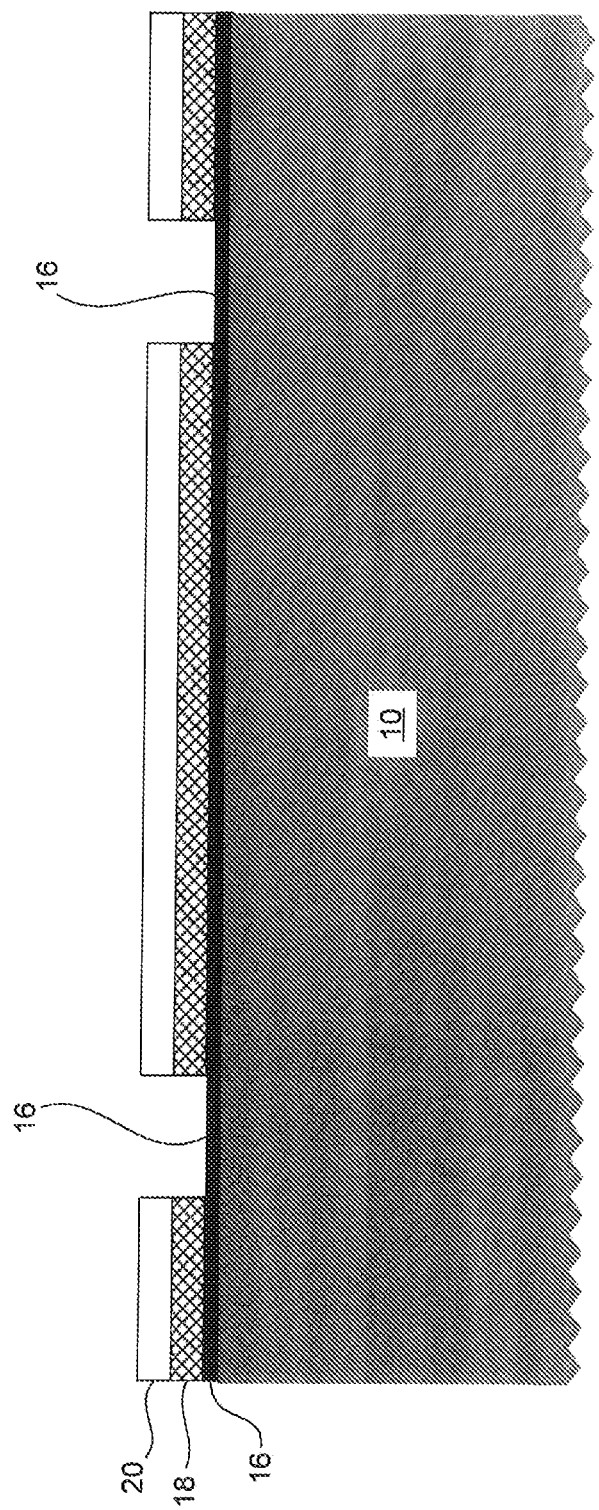

FIGS. 2A-2D are section views illustrating the solar cell of FIG. 1 during fabrication. Initially, as shown in FIG. 2A, silicon substrate 10, which can be either intrinsic or light doped, has a thin tunnel oxide 16 grown thereon which can have a thickness of from 10-20 angstroms, for example. Amorphous silicon layer 18 is then deposited with a boron dopant and a dopant concentration of $10^{20}$-$10^{21}$ or 10E20-10E21 atoms per cubic centimeter and to a thickness of 500 to 2000 angstroms. The growth of a doped silicon layer by vapor deposition is a known silicon process. Inclusion of an intrinsic layer under the p-type doped silicon layer can be made if a PIN structure is desired.

Thereafter, an insulating layer of silicon oxide 20 is deposited by low pressure chemical vapor deposition (LP-CVD, PECVD, APCVD), or by a spin on glass process. Silicon oxide layer 16 is 500 to 1000 angstroms in this illustrative embodiment.

Figure 2C:
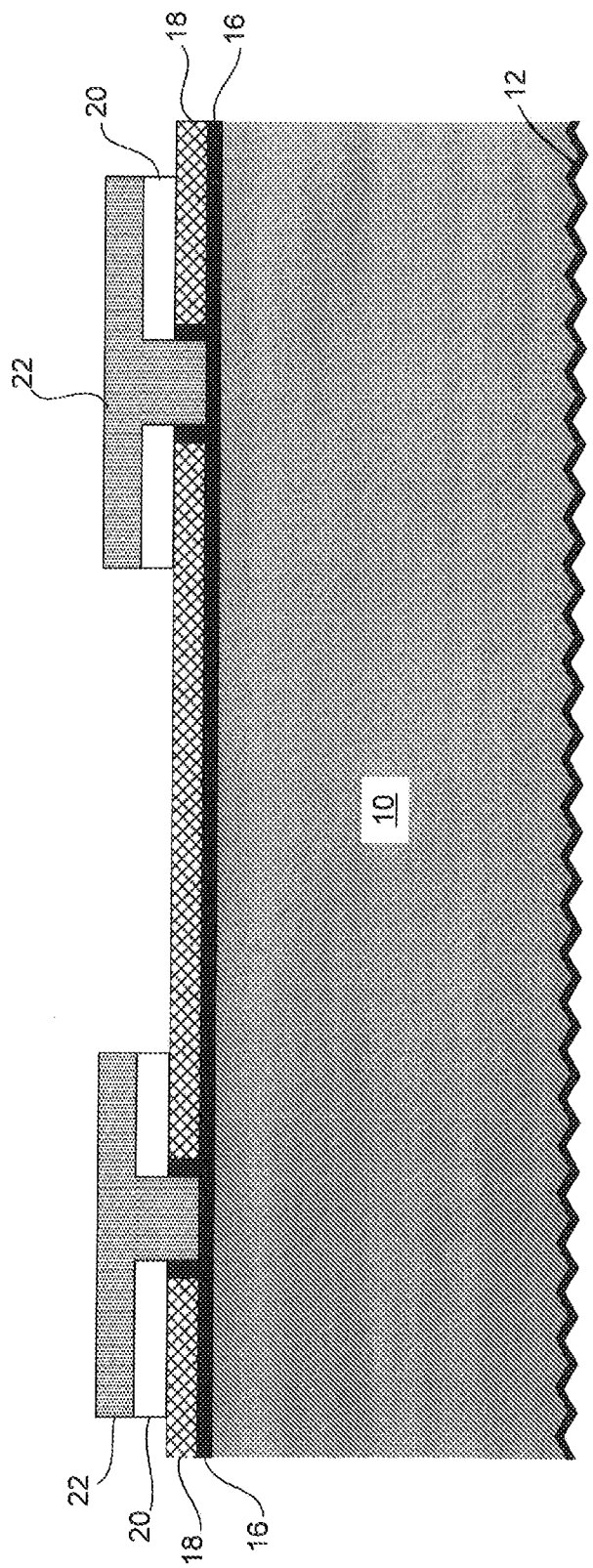

Thereafter, as illustrated in FIG. 213, the front surface of substrate 10 is textured by chemical or mechanical abrasion. This process step can precede the process steps of FIG. 2A, if desired. A photoresist mask is then formed on the back surface of the substrate 10 and etched to form openings through silicon oxide layer 20 and amorphous silicon 18 to substrate 10. The thin tunnel oxide is removed in the etching process also, and a new layer of tunnel silicon oxide is then applied on the exposed surface of substrate 10 through the etched openings by chemical growth. In forming tunnel oxide 16 in FIG. 213, tunnel oxide layer 12 can be simultaneously formed on the front surface. Following the growth of the thin tunnel oxide in the etched openings, again to a thickness of 10-20 angstroms, an N+ doped amorphous silicon layer 22 is deposited over the back surface, as shown in FIG. 2C.

Figure 2D:
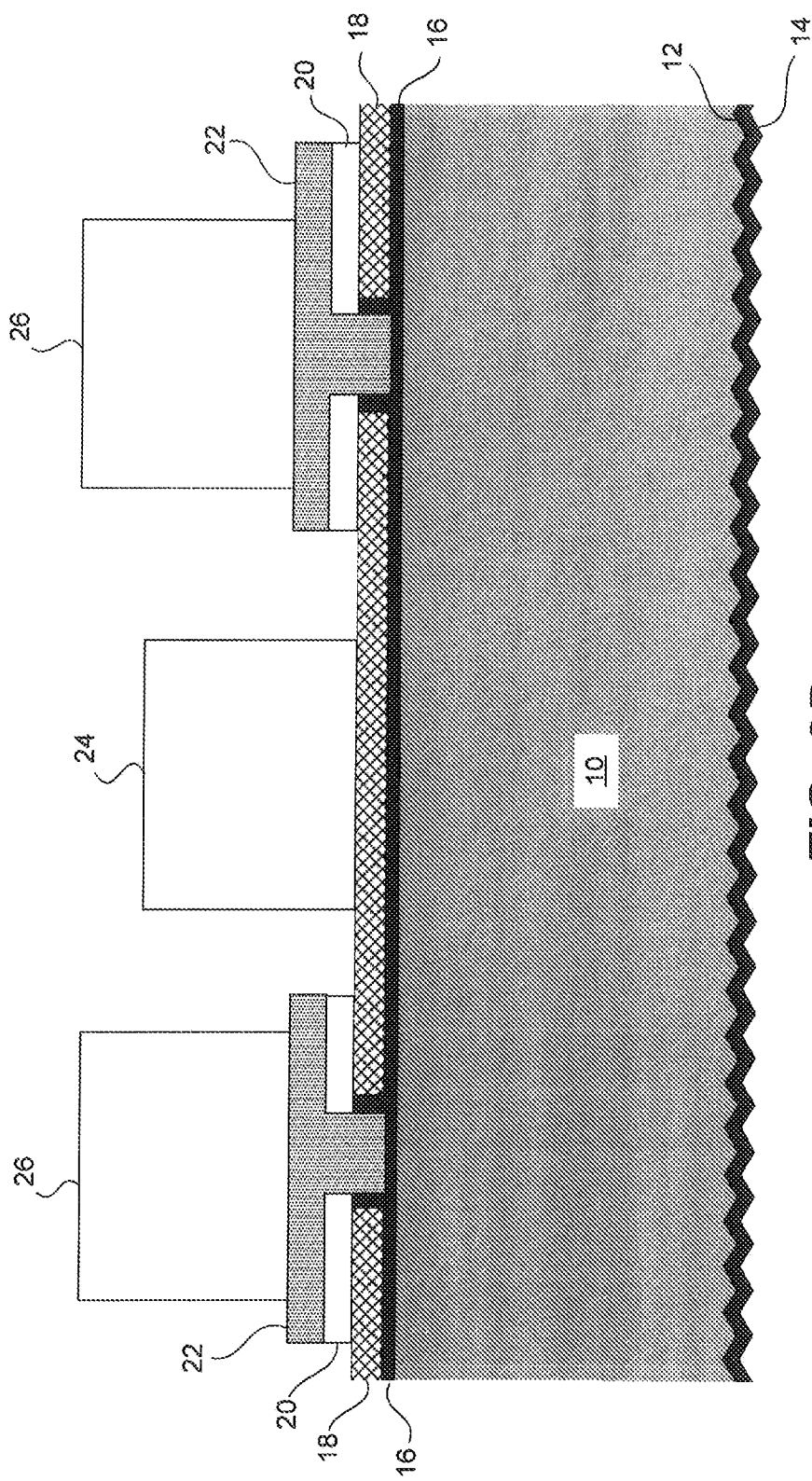

The layer 22 is doped with an N dopant such as phosphorus with a concentration of $10^{20}$-$10^{21}$ or 10E20-10E21 atoms per cubic centimeter. This can be deposited using plasma enhanced chemical vapor deposition (PECVD, LPCVD, APCVD). N+ amorphous silicon 22 is then masked and selectively etched to expose the underlying P+ amorphous silicon 18 for reception of metal contacts. In FIG. 2D, metal contacts 24 and 26 are made to P+ amorphous silicon 18 and N+ amorphous silicon 22 by metal deposition and photoresist masking and etching. The contacts can be formed by first scattering a seed layer of a conductive metal such as aluminum or copper and then pattern plating the seed metal to increase thickness. The cell is then completed by depositing a passivating layer 14 on tunnel oxide 12 on the front surface of substrate 10 using silicon nitride, doped silicon carbide, or N+ doped amorphous silicon.

A heterojunction solar cell in accordance with the invention, using doped amorphous silicon contacts is readily fabricated using conventional semiconductor processing techniques without the for high temperature processing. While the invention has been described with reference to an interdigitated back contact solar cell in which both P+ and N+ contacts are employed, the invention can be applied to solar cells having a single doped amorphous silicon on the back surface. Further, while the heterojunction is provided by amorphous silicon, other high band gap material such as germanium-silicon alloy, doped silicon carbide, or other III-V compound material can be employed in the contact structures. Thus, while the invention has been described with reference to specific embodiments, the description is illustrative of the invention and is not to be construed as limiting the invention. Various modifications and applications may occur to those skilled in the art without departing from the spirit and scope of the invention as defined by the appended claims.

What is claimed is:

1. A method of fabricating a solar cell, the method comprising:
   providing a silicon substrate;
   forming a tunnel oxide layer on a surface of the silicon substrate;
   forming a first pattern of acceptor-doped semiconductor material over the tunnel oxide layer to create a plurality of emitters of a first type;
   forming a second pattern of donor-doped semiconductor material over the tunnel oxide layer and interleaved with the first pattern to create a plurality of emitters of a second type; and
   forming a first conductive pattern interconnecting the acceptor-doped semiconductor material; and
   forming a second conductive pattern interconnecting the donor-doped semiconductor material.

2. The method of claim 1, wherein the tunnel oxide layer comprises silicon oxide.

3. The method of claim 1, wherein the surface of the silicon substrate is opposite a light-receiving surface of the silicon substrate.

* * * * *